(12) United States Patent
Wilhelm et al.

(10) Patent No.: US 11,906,452 B2
(45) Date of Patent: Feb. 20, 2024

(54) PH-SENSOR FOR DETERMINING AND/OR MEASURING A PH-VALUE OF A MEDIUM

(71) Applicant: Endress+Hauser Conducta GmbH+Co. KG, Gerlingen (DE)

(72) Inventors: Thomas Wilhelm, Chemnitz (DE); Mohammad Sadegh Ebrahimi, Lörrach (DE); Raphael Kuhnen, Schliengen (DE); Matthäus Speck, Göpfersdorf (DE)

(73) Assignee: Endress+Hauser Conducta GmbH+Co. KG, Gerlingen (DE)

( * ) Notice: Subject to any disclaimer, the term of this patent is extended or adjusted under 35 U.S.C. 154(b) by 0 days.

(21) Appl. No.: 17/664,468

(22) Filed: May 23, 2022

(65) Prior Publication Data

US 2022/0373487 A1    Nov. 24, 2022

(51) Int. Cl.
    *G01N 24/00*  (2006.01)
    *G01N 24/08*  (2006.01)
    *G01K 7/16*   (2006.01)

(52) U.S. Cl.
    CPC .............. *G01N 24/006* (2013.01); *G01K 7/16* (2013.01); *G01N 24/08* (2013.01)

(58) Field of Classification Search
    CPC ........ G01K 7/16; G01K 13/00; G01N 24/006; G01N 24/08; G01N 24/10; G01R 33/323
    See application file for complete search history.

(56) References Cited

U.S. PATENT DOCUMENTS

| 10,184,796 B2 | 1/2019 | Overstreet, II et al. |
| 2003/0211011 A1* | 11/2003 | Phillips ................. G01N 21/27 436/163 |

FOREIGN PATENT DOCUMENTS

| DE | 102014219550 A1 | 3/2016 |
| DE | 102017205099 A1 | 9/2018 |
| DE | 102017205265 A1 | 10/2018 |
| DE | 102018214617 A1 | 3/2020 |

(Continued)

OTHER PUBLICATIONS

Rendler, et al. Optical imaging of localized chemical events using programmable diamond quantum nanosensors, Nature Communications 8, 14701, Mar. 20, 2017, https://doi.org/10.1038/, 9 pp.

(Continued)

*Primary Examiner* — Jay Patidar
(74) *Attorney, Agent, or Firm* — Kelly J. Smith; Endress+Hauser (USA) Holding, Inc.

(57) ABSTRACT

The present disclosure relates to a pH-sensor for determining and/or monitoring a pH value of a medium, having a sensor unit with a wall in contact with the medium, and at least one pH-sensitive material, which has at least one spin state that changes as a function of a pH value. The at least one pH-sensitive material is arranged in or on a region of the wall in such a way that the at least one spin state is subjected to a change in the pH value of the medium. The pH-sensor also includes a spin-sensitive unit, which is configured to detect a variable associated with the at least one spin state, wherein the spin-sensitive unit is arranged in an environment of the at least one pH-sensitive material such that the spin-sensitive unit is subjected to a change in the spin state of the at least one pH-sensitive material.

15 Claims, 3 Drawing Sheets

(56) References Cited

FOREIGN PATENT DOCUMENTS

| DE | 102020123993 | A1 | 3/2022 |
| DE | 102021100223 | A1 | 7/2022 |
| EP | 0550240 | B1 | 8/1998 |
| JP | 466804 | A | 3/1992 |

OTHER PUBLICATIONS

Sow, et al., High-throughput nitrogen vacancy center imaging for nanodiamond photophysical characterization and pH nonsensing, Nanoscale, 2020, 12, 21821-21831.
Raabova, et al., Diamond nano-optode for fluorescent measurements of pH and temperature, Nanoscale, 2019, 11, 18537-18542.

* cited by examiner

PH-SENSOR FOR DETERMINING AND/OR MEASURING A PH-VALUE OF A MEDIUM

CROSS-REFERENCE TO RELATED APPLICATION

The present application is related to and claims the priority benefit of German Patent Application No. 10 2021 113 369.6, filed on May 21, 2021, the entire contents of which are incorporated herein by reference.

TECHNICAL FIELD

The present disclosure relates to a pH-sensor for determining and/or monitoring a pH value of a medium.

BACKGROUND

In environmental technology and in almost all industrial processes dealing with water, the pH value is a key measurement and influencing variable, since it influences the thermodynamics and kinetics of virtually all chemical reactions involving water. This relates to, for example, targeted reactions involving water, separation processes in aqueous systems, corrosion on and in reactors and conduit systems, the solubility of environmentally-active substances, or living conditions for organisms. The determination, such as the sensor measurement of the pH value in real time, is therefore an important task of environmental and process measurement technology.

The pH glass electrode is established as an important sensor of the pH value of a measurement medium; it can measure the pH value with low cross-sensitivities over a large measurement range, is chemically stable and durable, and delivers an electrical measurement signal from the outset. Fundamentally, a typical pH single-rod measuring cell, also referred to as a pH-sensor or, in many cases, as a pH electrode, consists of two, electrochemical half-cells, both of which are in contact with the measurement medium in different ways and between the electrodes of which an electrical voltage across the measurement medium is measured. The second half-cell serves here as a reference half-cell. A challenge in pH measurement with glass electrodes is the low conductivity of the glass membrane by which measurement is carried out, and thus the high impedance of the overall sensor in the range of 50 M$\Omega$ to 1 G$\Omega$ at 25° C.

A newer development in the field of sensor technology is represented by so-called quantum sensors, in which a wide variety of quantum effects are utilized for determining various physical and/or chemical measured variables. In the field of industrial process automation, such approaches are of interest, such as with regard to increasing efforts at miniaturization, while simultaneously increasing the performance of the respective sensors.

Quantum sensors are based upon the fact that certain quantum states of individual atoms can be controlled and read out very precisely. In this way, for example, precise and low-noise measurements of electrical and/or magnetic fields, as well as gravitational fields having resolutions in the nanometer range, are possible. In this context, various spin-based sensor arrangements have become known for which atomic transitions in crystal bodies are used for detecting changes in movements, electrical and/or magnetic fields, or even gravitation fields. Furthermore, different systems based upon quantum-optical effects, such as quantum gravimeters, NMR gyroscopes, or optically-pumped magnetometers have also become known, wherein at least the latter are, inter alia, based upon gas cells.

For example, in the field of spin-based quantum sensors, various devices have become known which use atomic transitions, e.g., in various crystal bodies, in order to detect even minor changes of movements, electrical and/or magnetic fields, or even gravitational fields. Typically, diamond having at least one silicon-vacancy center or at least one nitrogen-vacancy center, silicon carbide having at least one silicon-vacancy, or hexagonal boron nitride having at least one vacancy color center is used as the crystal body. The crystal bodies can in principle have one or more vacancies.

From DE 10 2017 205 099 A1, a sensor device having a crystal body with at least one vacancy, a light source, a high-frequency device for applying a high-frequency signal to the crystal body, and a detection unit for detecting a magnetic-field-dependent fluorescence signal has become known. The light source is arranged on a first substrate, and the detection device is arranged on a second substrate, while the high-frequency device and the crystal body can be arranged on the two, interconnected substrates. External magnetic fields, electrical currents, a temperature, mechanical stress, or a pressure are suitable as measured variables. A similar device has become known from DE 10 2017 205 265 A1.

DE 10 2014 219 550 A1 describes a combination sensor for detecting pressure, temperature, and/or magnetic fields, wherein the sensor element has a diamond structure with at least one nitrogen-vacancy center.

DE 10 2018 214 617 A1 discloses a sensor device, which likewise has a crystal body with a number of color centers, in which different optical filter elements are used for increasing effectiveness and for miniaturization.

From the as yet unpublished German patent application with the file number 10 2020 123 993.9, a sensor device has become known which uses a fluorescence signal of a crystal body having at least one vacancy to evaluate a process variable of a medium. In addition, a state monitoring of the respective process is carried out on the basis of a variable that is characteristic for the magnetic field, such as the magnetic permeability or magnetic susceptibility. From the also as yet unpublished German patent application with the file number 10 2021 100223.0, a limit-level sensor has, moreover, become known, in which a statement about a limit level is determined on the basis of the fluorescence.

A further sub-field within the field of quantum sensors relates to gas cells in which atomic transitions and spin states for, inter alia, determining magnetic and/or electrical properties can be visually queried. In general, a gaseous alkali metal and a buffer gas are present in the gas cell. Magnetic properties of a surrounding medium can be determined by Rydberg states generated in the gas cell.

For example, gas cells are used in quantum-based standards, which provide physical variables with high precision. Thus, they have long been used in frequency standards or atomic clocks, as is known from EP 0 550 240 B1.

U.S. Pat. No. 10,184,796 B2 further discloses an atomic gyroscope in chip size, in which a gas cell is used to determine the magnetic field. An optically-pumped magnetometer based upon a gas cell is known from U.S. Pat. No. 9,329,152 B2. By manipulating the atomic states in gas cells, further fields of application of gas cells can be deduced. Thus, JP 4066804 A2 describes the use of gas cells for determining absolute path lengths. Furthermore, gas cells are also used as a starting point for microwave sources, as described in EP 1 224 709 B1.

First approaches for a pH-sensor based upon quantum effects have already become known from the scientific literature. Jörg Wrachtrup et al. describe a determination of the pH value by means of a diamond having nitrogen-vacancy centers which is functionalized on its surface with paramagnetic Gd complexes (Nature Communications 2017, 8, 14701). As a connection between the diamond surface and the Gd complexes, a chemical switch is used which, under the influence of the pH value, releases the Gd complexes in a controlled and irreversible manner. The accuracy of the pH measurement achieved thereby is approximately 0.7 pH units. After release, the Gd complexes are located in the medium and cannot be connected again to the diamond surface.

Kapanidis et al. showed a dependence of the lifetime of various charge states upon the NV centers of nanodiamonds at various pH values (Nanoscale 2020, 12, 21821). However, the lifetimes of the charge states were not stable over several measurement cycles, which, according to the authors, could be caused by changes to the surface of the nanodiamond.

Cigler et al. describe nanodiamonds having a pH-sensitive and temperature-sensitive polymer shell (Nanoscale, 2019, 11, 18537). An increase in the pH value leads to an increase of negative charges in the polymer shell and thus to a swelling of the polymer shell, which results in a change in the fluorescence spectrum of the NV center. Under process conditions, the swelling and shrinking of the polymer shell can be impaired by further molecules of the medium.

SUMMARY

The aim of the present disclosure is therefore to specify a pH-sensor which represents an alternative to previous pH-sensors.

According to the present disclosure, the aim is achieved by a pH-sensor for determining and/or monitoring a pH value of a medium, having a sensor unit having a wall, wherein the wall is in contact with the medium, and at least one pH-sensitive material which has at least one spin state that changes as a function of a pH value, wherein the at least one pH-sensitive material is arranged in or on a region of the wall in such a way that the at least one spin state is subjected to a change in the pH value of the medium. The pH-sensor also has a spin-sensitive unit which is configured to detect a variable associated with the at least one spin state, wherein the spin-sensitive unit is arranged in an environment of the at least one pH-sensitive material in such a way that the spin-sensitive unit is subjected to a change in the spin state of the at least one pH-sensitive material, and an evaluation unit which determines the pH value of the medium on the basis of the variable which is detected by the spin-sensitive unit and is associated with the at least one spin state.

In contrast to pH glass electrodes, the pH-sensor according to the present disclosure does not require a reference electrode. The pH-sensitive material changes its at least one spin state depending upon the pH value of the medium; generally, the pH-sensitive material is at least partially in contact with the medium. By reading out the variable associated with the at least one spin state by means of the spin-sensitive unit, the pH value of the medium can be determined. The spin-sensitive unit has a defined distance from the pH-sensitive material. The spin-sensitive unit and/or the pH-sensitive material are not consumed when the pH value is being determined; the pH value is not determined using an irreversible process. The pH-sensor according to the present disclosure is chemically stable and does not release ions or molecules into the medium. Instead of a single pH-sensitive material, several different pH-sensitive materials can also be used to extend the measuring range with respect to the pH value.

The change in the spin state of the pH-sensitive material can be caused by a changed occupation of the energy levels, a reversal of spins, and/or a changed spin energy of the pH-sensitive material. Further, a change in the spin state can lead to a transition from a dimagnetism to a paramagnetism of the pH-sensitive material, and vice versa. In general, the spin state of the pH-sensitive material is defined by the spins of the electrons, each having a magnetic dipole moment and interacting with any external magnetic fields that may be present.

In one possible embodiment, a magnetic field device is provided which generates a magnetic field at least in the region of the pH-sensitive material. The magnetic field leads, for example, to splitting of the energy states of the pH-sensitive material (Zeeman splitting). Furthermore, the magnetic field can strengthen a change in the magnetic field which results from a change in the spin state, so that the change in the spin state can be read out more easily for the spin-sensitive unit on the basis of the variable associated with the spin state, or even smaller changes in the spin state can be read out. However, depending upon the measurement location, there can already be weak magnetic fields present in the environment, which are sufficient for determining, by means of the spin-sensitive unit, the spin state or a change in the spin state on the basis of the variable associated with the at least one spin state.

In one possible embodiment, the spin-sensitive unit is a crystal body having at least one vacancy or a gas cell. Crystal bodies having at least one vacancy as well as gas cells show, under appropriate optical excitation, a fluorescence signal which is dependent, inter alia, upon a magnetic field applied to the crystal body or the gas cell. The spin state of the pH-sensitive material influences the applied magnetic field, so that the spin state can be read out on the basis of the fluorescence signal. The fluorescence signal is the variable associated with the at least one spin state. Optionally, the crystal body is additionally excited with a high-frequency or microwave signal. Both the crystal body having the at least one vacancy center and the gas cell lead to an improvement in the measurement accuracy of the detection of the spin state and thus of the pH value due to their high-sensitivity to magnetic fields. Furthermore, a statement regarding the magnetic flux density, the magnetic susceptibility, the magnetic permeability, or a further variable related to at least one of these variables can be determined on the basis of the fluorescence signal.

Preferably, the crystal body is a diamond having at least one silicon-vacancy center or at least one nitrogen-vacancy center, is silicon carbide having at least one silicon-vacancy, or is hexagonal boron nitride having at least one vacancy color center.

Advantageously, the gas cell is a cell enclosing at least one gaseous alkali metal.

In a further embodiment, the spin-sensitive unit has an excitation unit for optical excitation of the crystal body or of the gas cell and a detection unit for detecting a fluorescence signal of the crystal body or of the gas cell. Optionally, filters and mirrors as well as further optical elements can be used to direct an excitation light to the crystal body or to the gas cell and/or the fluorescence signal towards the detection unit.

In one possible embodiment, the at least one pH-sensitive material and the spin-sensitive unit are embedded in the wall of the sensor unit. The pH-sensitive material is at least partially in contact with the medium. For example, the spin-sensitive unit can be sintered together with the pH-sensitive material into a glass.

In an alternative embodiment, the spin-sensitive unit is configured as a first layer, which is applied to a surface, facing away from the medium, of the wall, wherein the at least one pH-sensitive material is embedded in the wall of the sensor unit. The spin-sensitive unit can be applied to the wall of the sensor unit by means of known methods, such as chemical/physical vapor deposition.

In a further alternative embodiment, the at least one pH-sensitive material is configured as a second layer, which is applied to a surface, facing the medium, of the wall, wherein the spin-sensitive unit is configured as a third layer, which is arranged between the second layer and the wall or on a surface, facing away from the medium, of the wall.

The at least one pH-sensitive material preferably comprises an oxidic or nitridic species. In the context of this application, species is understood to mean an ion, a molecule, or a compound. Depending upon the pH value of the medium, there is a change in the environment of the pH-sensitive material, e.g., by exchange of the ligands bound to the species, resulting in a change in the spin state of the pH-sensitive material. Relevant ligands include protons, hydronium ions, and hydroxyl ions.

Advantageously, the at least one pH-sensitive material comprises Ti(III) ions. Ti(III) ions alternate between a spin state having low spin energy (low spin) and a spin state having higher energy (high spin), depending upon the pH value of the medium. If appropriate, the Ti(III) ions can be oxidized to Ti(IV) ions by influence of oxygen-containing ligands at high pH values.

In one possible embodiment, the Ti(III) ions can be produced by an excess of Ti(IV) ions in a glass containing TiO2. Ti(III) ions are produced in a so-called self-doping process in titanium dioxide. This can occur by means of an excess of Ti(IV) ions in conjunction with a reducing agent.

Advantageously, the wall of the sensor unit is made of glass.

In a further embodiment, the evaluation unit is configured to determine and/or monitor a temperature of the medium on the basis of the variable associated with the at least one spin state. For example, the crystal body having the at least one vacancy has a temperature-dependent, zero-field splitting. The fluorescence signal of the crystal body is a measure both of the at least one spin state of the pH-sensitive material and of the temperature of the medium. To determine the temperature and the pH value on the basis of the fluorescence signal, a different evaluation algorithm is necessary in each case.

In an alternative embodiment, a temperature sensor is arranged in the region of the sensor unit in such a way that the temperature sensor determines and/or monitors a temperature of the medium. For example, the temperature sensor is a platinum resistance thermometer.

BRIEF DESCRIPTION OF THE DRAWINGS

The present disclosure is explained in more detail below with reference to FIGS. 1-5. The following are shown.

DETAILED DESCRIPTION

Figure 1:
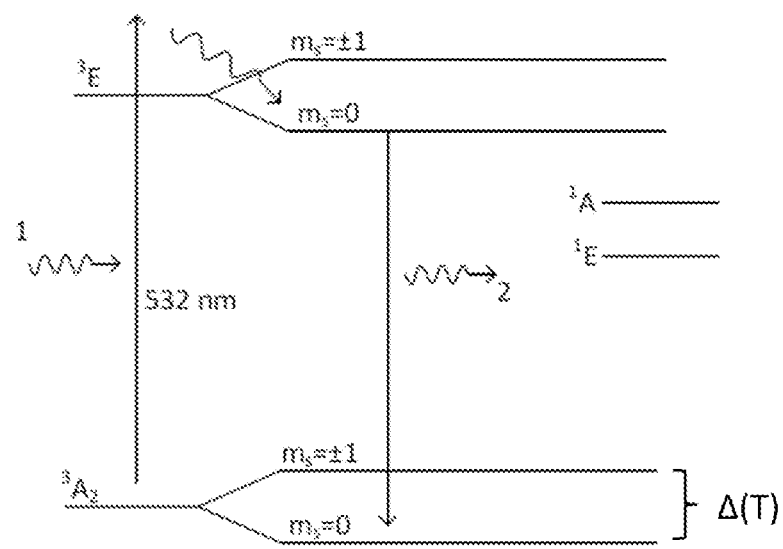
FIG. 1 shows a simplified energy scheme for a negatively-charged NV center in a diamond.

FIG. 1 shows a simplified energy scheme for a negatively-charged nitrogen-vacancy center (NV center) in a diamond in order to explain the excitation and fluorescence of a vacancy in a crystal body by way of example. The following considerations can be transferred to other crystal bodies having corresponding vacancies.

In the diamond, each carbon atom is typically covalently bonded to four further carbon atoms. A nitrogen-vacancy center (NV center) consists of a vacancy in the diamond lattice, i.e., an unoccupied lattice space, and a nitrogen atom as one of the four neighboring atoms. The negatively-charged NVME centers are important for the excitation and evaluation of fluorescence signals. In the energy scheme of a negatively-charged NV center, there is, in addition to a triplet basic state 3A, an excited triplet state 3E, each of these having three magnetic sub-states $ms=0,\pm1$. Furthermore, two, metastable singlet states 1A and 1E are located between the basic state 3A and the excited state 3E. In the absence of an external magnetic field, the two states $ms=+/-1$ are split from the basic state $ms=0$, which is referred to as zero-field splitting $\Delta(T)$ and which is dependent upon the temperature T.

Through excitation light 1 from the green region of the visible spectrum, i.e., for example, an excitation light 1 having a wavelength of 532 nm, an excitation of an electron from the basic state 3A into a vibration state of the excited state 3E takes place which, while emitting a fluorescence photon 2 with a wavelength of 630 nm, reverts to the basic state 3A. This fluorescence signal is a measure of the zero-field splitting $\Delta(T)$ and can be used to determine and/or monitor the temperature T.

An applied magnetic field having a magnetic field strength B leads to a splitting (Zeeman splitting) of the magnetic sub-states, so that the basic state consists of three, energetically-separated sub-states, each of which can be excited. However, the intensity of the fluorescence signal is dependent upon the respective magnetic sub-state from which it has been excited, so that, based upon the distance between the fluorescence minima, the magnetic field strength B, for example, can be calculated using the Zeeman formula. The magnetic field strength B is modified by the at least one spin state of the pH-sensitive material 8 or arises as a result thereof.

In the context of the present disclosure, further possibilities for evaluating the fluorescence signal are provided, such as the evaluation of the intensity of the fluorescent light, which is likewise proportional to the applied magnetic field. An electrical evaluation can in turn be done, for example, via a Photocurrent Detection of Magnetic Resonance (PDMR). In addition to these examples of evaluation of the fluorescence signal, there are further possibilities which also fall under the present disclosure.

Figure 2:
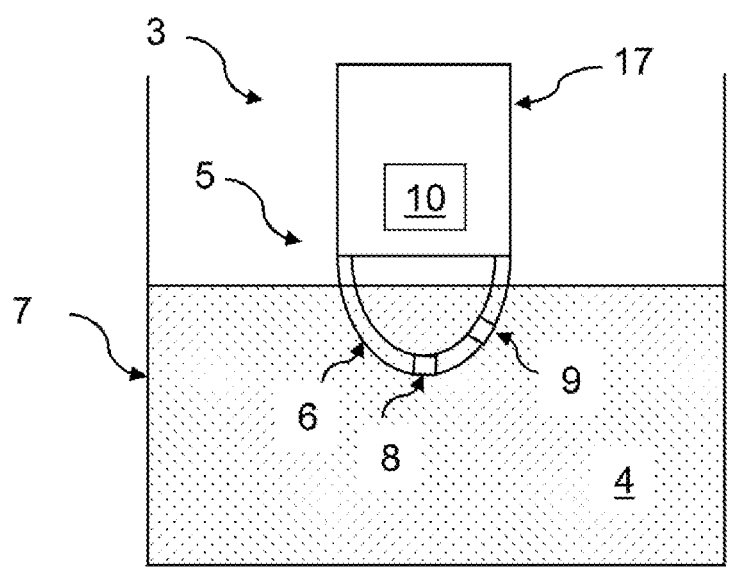
FIG. 2 shows a first embodiment of the pH-sensor according to the present disclosure.

FIG. 2 shows a first embodiment of the pH-sensor 3 according to the present disclosure for determining and/or monitoring a pH value of a medium 4. The pH-sensor 3 comprises a sensor unit 5 with a wall 6 which closes off the sensor unit 5 from the medium 4. The wall 6 is accordingly at least partially in contact with the medium 4, which is, for example, located in a container 7. The medium 4 may, alternatively, be present in a tube. Located in the region of the sensor unit 5 is at least one pH-sensitive material 8 and the spin-sensitive unit 9. The evaluation unit 10, which determines the pH value of the medium 4 on the basis of the variable read out by the spin-sensitive unit and associated with the at least one spin state, can be arranged in the region of the sensor unit 5 or a further unit. In FIG. 1, the evaluation unit 10 is arranged by way of example in a housing 17 connected to the sensor unit 5. Further electronics, as well as connections and means for electrical supply and/or for data transmission, can optionally be located in the housing 17. The evaluation unit 10 can also be arranged separately from the sensor unit.

At least one pH-sensitive material 8, which has at least one spin state that changes as a function of a pH value, can also be arranged in a region of the wall 6. Accordingly, the pH-sensitive material 8 is arranged in such a way that the at least one spin state experiences a change in the pH value of the medium 4. The spin-sensitive unit 9 is configured to detect a variable that is associated with the at least one spin state and is therefore arranged in the region of the at least one pH-sensitive material 8 in such a way that the spin-sensitive unit 9 is subject to a change in the spin state.

Figure 3:
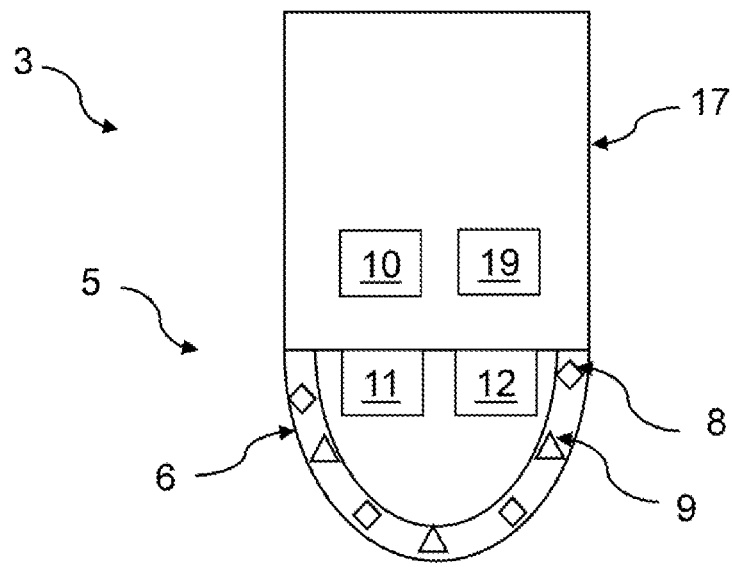
FIG. 3 shows a second embodiment of the pH-sensor according to the present disclosure.
Figure 4:
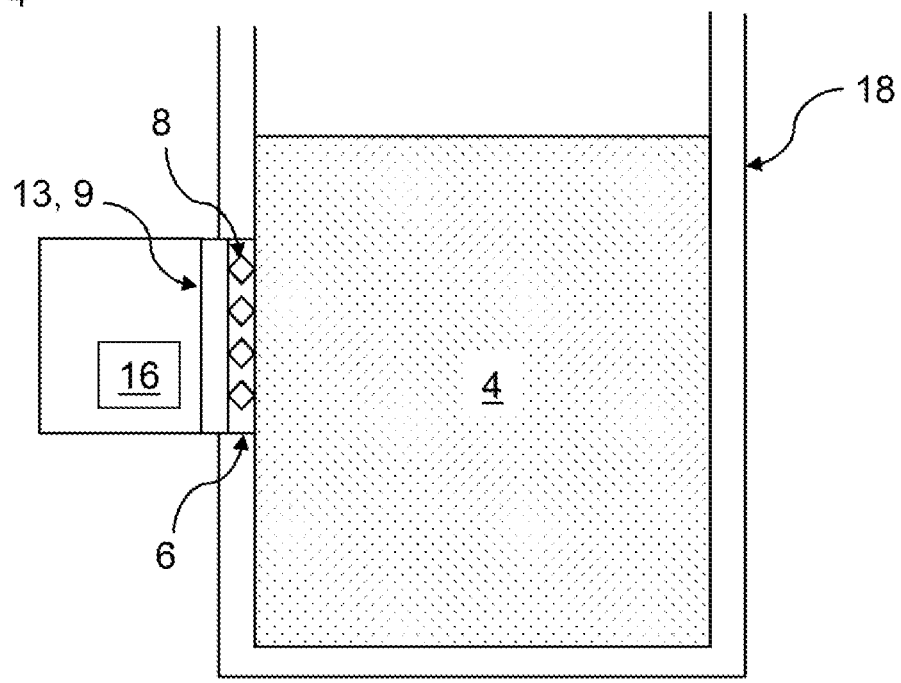
FIG. 4 shows a third embodiment of the pH-sensor according to the present disclosure.

The following figures, FIGS. 3-5, show different embodiments of the pH-sensor and the arrangements of the pH-sensitive material 8 and of the spin-sensitive unit 9. In FIG. 3, both the pH-sensitive material 8 and the spin-sensitive unit 9 are embedded in the wall 6. For example, the spin-sensitive unit 9 is a crystal body having at least one vacancy, such as a diamond having at least one silicon-vacancy center or at least one nitrogen-vacancy center, is silicon carbide having at least one silicon-vacancy, or is hexagonal boron nitride having at least one vacancy color center. Alternatively, the spin-sensitive unit 9 can also be a gas cell, e.g., a cell enclosing at least one gaseous alkali metal.

The wall 6 is made of, for example, glass, and the pH-sensitive material 8 can optionally have an oxidic or nitridic species or Ti(III) ions, which, for example, can be produced by an excess of Ti(IV) ions in a glass containing $TiO_2$. Thus, the example shown in FIG. 3 can be a glass wall 6 in which diamonds having at least one silicon or nitrogen-vacancy center and Ti(III) ions are embedded.

The crystal body or the gas cell can be optically read out, so that the spin-sensitive unit 9 further has an excitation unit 11 for the optical excitation of the crystal body or of the gas cell and a detection unit for detecting a spin-state-dependent fluorescence signal of the crystal body or of the gas cell. The excitation unit 11 and the detection unit 12 can be arranged, for example, in the region of the sensor unit. Alternatively, they can also be spaced apart from the wall 6, and optical light guides can be used for conducting the excitation light and the fluorescent light between the spin-sensitive unit 9 and the excitation unit 11 and the detection unit 12.

Optionally, the pH-sensor 3 can have a magnetic field device 19, e.g., a coil or a permanent magnet, which, at least in the region of the pH-sensitive material 8, generates a magnetic field.

FIG. 4 shows a third embodiment of the pH-sensor 3 according to the present disclosure in which the wall 6 terminates with a container wall 18. The pH-sensitive material 8 is embedded by way of example in the wall 6, whereas the spin-sensitive unit is applied as the first layer 13 on a surface, facing away from the medium 4, of the wall 6. Optionally, a temperature sensor can 16 can be provided for determining and/or monitoring the temperature of the medium 4 in the region of the sensor unit 5. For example, the temperature sensor 16 is a Pt resistance thermometer. Alternatively, the evaluation unit is 10 designed to determine and/or monitor a temperature of the medium 4 based upon the variable associated with the at least one spin state.

Figure 5A:
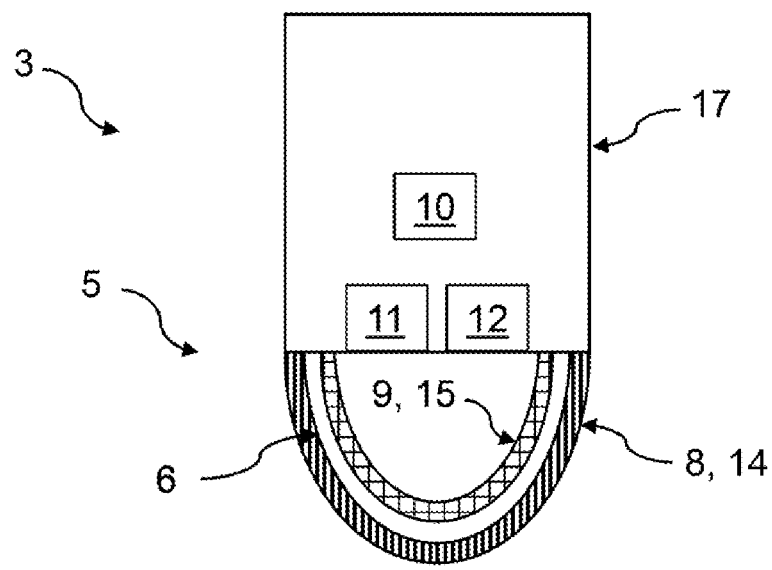
FIG. 5a and FIG. 5b show a fourth embodiment of the pH-sensor according to the present disclosure.
Figure 5B:
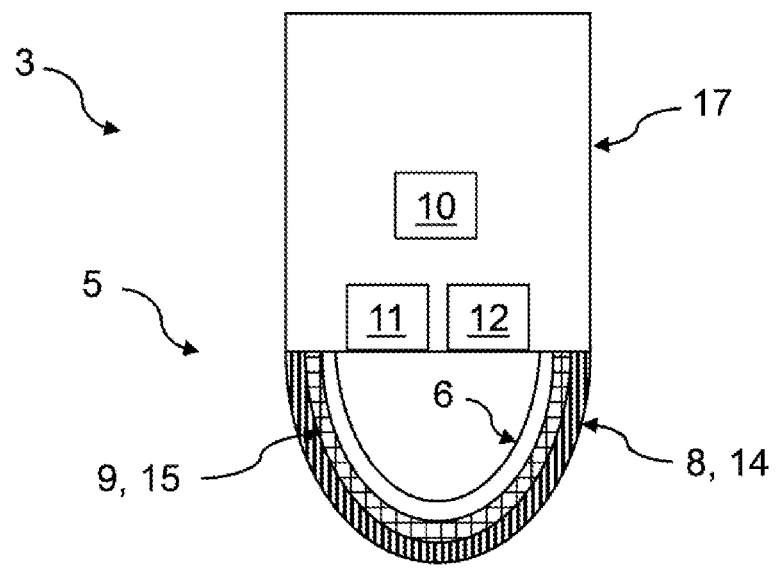

The pH-sensitive material 8 and spin-sensitive unit 9 can, alternatively, both be configured as layers, as shown in FIG. 5. The pH-sensitive material 8 is applied as a second layer 14 on a surface, facing the medium 4, of the wall 6. The spin-sensitive unit 9 is applied as a third layer 15 on a surface, facing away from the medium 4, of the wall 6 (FIG. 5*a*) or between the second layer 14 and the wall 6 (FIG. 5*b*).

The invention claimed is:

1. A pH-sensor for determining and/or monitoring a pH value of a medium, having:
   a sensor unit with a wall, wherein the wall is in contact with the medium,
   at least one pH-sensitive material, which has at least one spin state that changes as a function of a pH value, wherein the at least one pH-sensitive material is arranged in or on a region of the wall in such a way that the at least one spin state is subjected to a change in the pH value of the medium,
   a spin-sensitive unit, which is configured to detect a variable associated with the at least one spin state, wherein the spin-sensitive unit is arranged in an environment of the at least one pH-sensitive material in such a way that the spin-sensitive unit is subjected to a change in the spin state of the at least one pH-sensitive material, and
   an evaluation unit which, based upon the variable detected by the spin-sensitive unit and associated with the at least one spin state, determines the pH value of the medium.

2. The pH-sensor according to claim 1, wherein the spin-sensitive unit is a crystal body having at least one vacancy or is a gas cell.

3. The pH-sensor according to claim 2, wherein the crystal body is a diamond having at least one silicon-vacancy center or at least one nitrogen-vacancy center, is silicon carbide having at least one silicon-vacancy, or is hexagonal boron nitride having at least one vacancy color center.

4. The pH-sensor according to claim 2, wherein the gas cell is a cell enclosing at least one gaseous alkali metal.

5. The pH-sensor according to claim 2, wherein the spin-sensitive unit has an excitation unit for optical excitation of the crystal body or of the gas cell and a detection unit for detecting a spin-dependent fluorescence signal of the crystal body or of the gas cell.

6. The pH-sensor according to claim 1, wherein the at least one pH-sensitive material and the spin-sensitive unit are embedded in the wall of the sensor unit.

7. The pH-sensor according to claim 1, wherein the spin-sensitive unit is configured as a first layer, which is applied on a surface, facing the medium, of the wall, wherein the at least one pH-sensitive material is embedded in the wall of the sensor unit.

8. The pH-sensor according to claim 1, wherein the at least one pH-sensitive material is configured as a second layer, which is arranged on a surface, facing the medium, of the wall, wherein the spin-sensitive unit is configured as a third layer, which is arranged between the second layer and the wall or on a surface, facing away from the medium, of the wall.

9. The pH-sensor according to claim 1,
wherein the at least one pH-sensitive material comprises an oxidic or nitridic species.

10. The pH-sensor according to claim 1,
wherein the at least one pH-sensitive material comprises Ti(III) ions.

11. The pH-sensor according to claim 10,
wherein the Ti(III) ions can be produced by an excess of Ti(IV) ions in a glass containing $TiO_2$.

12. The pH-sensor according to claim 1,
wherein the wall the sensor unit is made of glass.

13. The pH-sensor according to claim 1,
wherein a temperature sensor is arranged in the region of the sensor unit in such a way that the temperature sensor determines and/or monitors a temperature of the medium.

14. The pH-sensor according to claim 1,
wherein the evaluation unit is configured to determine and/or monitor a temperature of the medium on the basis of the variable associated with the at least one spin state.

15. The pH-sensor according to claim 1,
wherein a magnetic field device is provided which generates a magnetic field at least in the region of the pH-sensitive material.

* * * * *